(12) United States Patent
Teshirogi et al.

(10) Patent No.: US 7,563,343 B2
(45) Date of Patent: Jul. 21, 2009

(54) FILM LAMINATION APPARATUS AND METHOD AND A MANUFACTURING METHOD OF A SEMICONDUCTOR APPARATUS

(75) Inventors: Kazuo Teshirogi, Kawasaki (JP); Yuzo Shimobeppu, Kawasaki (JP); Yoshiaki Shinjo, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 814 days.

(21) Appl. No.: 10/718,653

(22) Filed: Nov. 24, 2003

(65) Prior Publication Data

US 2004/0106301 A1 Jun. 3, 2004

(30) Foreign Application Priority Data

Nov. 29, 2002 (JP) .............................. 2002-348788

(51) Int. Cl.
*B32B 37/00* (2006.01)
(52) U.S. Cl. .............................. 156/308.2; 427/428.01; 427/428.07; 492/46
(58) Field of Classification Search .............. 156/308.2, 156/309.6; 427/428.01, 428.07, 426.07; 492/46
See application file for complete search history.

(56) References Cited

U.S. PATENT DOCUMENTS 3,040,489 A * 6/1962 Da Costa ..................... 53/435
3,501,128 A * 3/1970 Pool ........................... 251/175
3,749,621 A * 7/1973 Schoffner ..................... 156/86
5,051,475 A * 9/1991 Tsunashima et al. ......... 525/175
5,336,703 A * 8/1994 Homma et al. .............. 523/435

FOREIGN PATENT DOCUMENTS

| JP | 54124968 A | * | 9/1979 |
| JP | 06104317 A | * | 4/1994 |
| JP | 7-25463 | | 3/1995 |
| JP | 7-74131 A | | 3/1995 |
| JP | 2001-185563 A | | 7/2001 |
| JP | 2002-76096 | | 3/2002 |
| JP | 2002-208571 A | | 7/2002 |

OTHER PUBLICATIONS

English abstract for JP 54124968, 1979.*
English abstract for JP 06104317, 1994.*
Japanese Office Action dated Sep. 3, 2007, issued in corresponding Japanese Application No. 2002-348788.

* cited by examiner

*Primary Examiner*—John L Goff
(74) *Attorney, Agent, or Firm*—Westerman, Hattori, Daniels & Adrian, LLP.

(57) ABSTRACT

In a film lamination apparatus and method, there is no one-side contact of a pressing roller that presses a film to be laminated. The film is laminated using a rotatable pressing roller having a heater incorporated therein. The pressing roller is pressed onto the film placed on a semiconductor substrate while generating heat by the heater inside the pressing roller. The pressing roller is rolled on the film so as to laminate the film on the semiconductor substrate by partially heating the film by the pressing roller while moving the pressing roller.

5 Claims, 9 Drawing Sheets

FILM LAMINATION APPARATUS AND METHOD AND A MANUFACTURING METHOD OF A SEMICONDUCTOR APPARATUS

BACKGROUND OF THE INVENTION

1. Field of the Invention

The present invention relates to a method and apparatus for laminating a film onto a semiconductor substrate and a manufacturing method of a semiconductor device using the film lamination method and, more particularly, to a method of laminating a die-attachment film, such as a die-attachment sheet material or a fixation film, onto a backside of a semiconductor substrate.

2. Description of the Related Art

In a manufacturing process of a semiconductor device such as a semiconductor integrated circuit (IC), circuit elements such as a transistor, a resistor, etc., and wiring layers for mutually connecting the circuit elements and further external connection electrodes are formed on one of the principal surfaces of a semiconductor substrate such as a silicon wafer so that a plurality of semiconductor element areas are formed on the one of the principal surfaces.

Thereafter, in a so-called post process, thinning of the substrate is performed by grinding another principal surface (backside) of the semiconductor substrate, and individualization of chips is performed by dividing (dicing) each of the semiconductor element areas, and further each semiconductor chip is subjected to encapsulation or accommodation into a container.

In such a post process, when encapsulating the semiconductor chip or accommodating the semiconductor chip into a container, a process is taken in which the semiconductor chip is firmly attached onto a lead frame or a support substrate such as a resin substrate or a ceramic substrate. Conventionally, a paste or a film for fixing the chip is previously applied onto a die stage of the lead frame or a chip mounting part of the support substrate, and, thereafter, the chip is mounted and fixed.

Accordingly, the mounting and fixing process of the semiconductor element is complicated and troublesome.

In order to attempt an increase in efficiency of the mounting/adhesion process of the semiconductor element, it is suggested to apply or laminate, prior to the dicing process of the semiconductor substrate, a die-attachment film (a die-attachment sheet material, a fixation film) onto the entire backside of the semiconductor substrate and, thereafter, the dicing process is performed.

According to the above-mentioned approach, an adhesive layer for adhesion is provided on the backside of each of the individualized semiconductor chips. Thus, the semiconductor chip can be easily mounted and fixed onto the die stage or the chip mounting part of the support substrate, which results in an increase in efficiency of the assembly process.

It should be noted that the die-attachment film is made of, for example, an epoxy resin as a main body, and generates an adhesion force by being heated.

Figure 1:
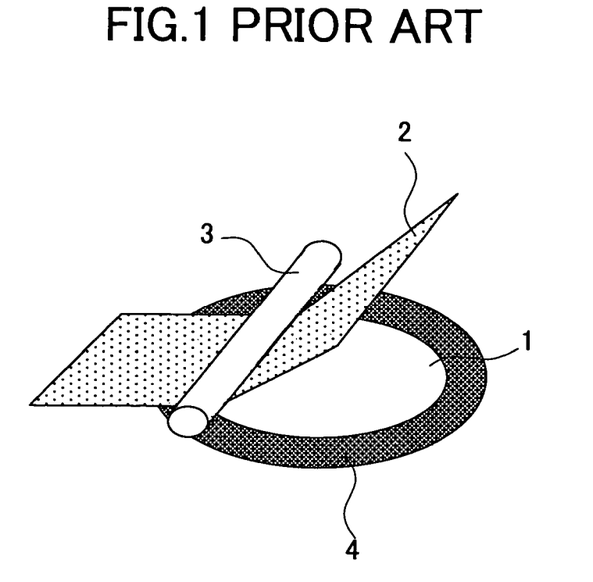
FIG. 1 is an illustration showing a conventional film lamination apparatus provided with a table into which a heat source is incorporated.

In the lamination process of the die-attachment film onto the backside of the semiconductor substrate, as shown in FIG. 1, a die-attachment film 2 is laminated on the top surface of the semiconductor substrate 1 by pressing a rubber made pressing roller 3 against the die-attachment film 2 arranged on the top surface of the semiconductor substrate 1 while heating the entire surface of the semiconductor substrate 1 by a heater from the bottom surface of the semiconductor substrate 1 in the process of laminating the die-attachment film 2 after back-grinding the semiconductor substrate 1. That is, it is a method of heating a work (semiconductor substrate 1) by heating a table 4 on which the work is attached by embedding a heat generator (heater) in the table 4. Such a method is disclosed in Japanese Laid-Open Patent Application No. 2002-76096.

The above-mentioned method has no problem if the work has a sufficient strength. However, if the semiconductor substrate is thinned and the strength is reduced, there is a problem in that the semiconductor substrate cracks due to a thermal stress caused by a thermal expansion when the semiconductor substrate is entirely heated in the process of laminating the die-attachment film.

Figure 2:
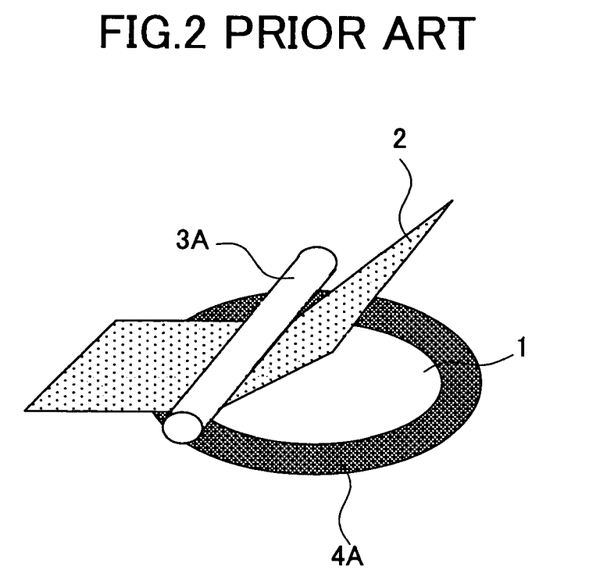
FIG. 2 is an illustration showing a conventional film lamination apparatus provided with a pressing roller into which a heat source is incorporated.

As measures for solving such a problem, a method is suggested in which the adhesion and fixation of the semiconductor surface onto the entire bottom surface of the semiconductor substrate 1 is not performed and, instead, the die-attachment film 2 is heated by a metal made pressing roller 3A in which a heat source or heat-generating part is incorporated as shown in FIG. 2. In this case, it is not necessary to incorporate a heat source into the table 4A.

Moreover, another method is suggested in which the die-attachment film 2 is laminated by heating while blowing a hot air onto the die-attachment film 2 or the semiconductor substrate 1 at a position immediately before the pressing roller 3 in a moving direction of the pressing roller 3.

Furthermore, Japanese Patent Publication NO. 7-25463 suggests a method in which a plurality of rollers having different widths are arranged so as to laminate the die-attachment film by consecutively pressing the rollers onto the die attachment film from one having a smaller width. This method is especially effective in laminating the die-attachment film while preventing air entering between the die-attachment film and a warped semiconductor substrate.

With the miniaturization and speeding up of electronic equipment, semiconductor devices to be incorporated in the electronic equipment are required for further miniaturization and high-density mounting. For this reason, there is a demand for thinning the semiconductor devices. However, it was difficult to laminate a die-attachment film on a thin semiconductor substrate by using the above-mentioned conventional method.

As mentioned above, if an entire surface of a semiconductor substrate is heated, the semiconductor substrate cracks due to a thermal stress. Thus, in order to avoid such a problem, it is effective to laminate a die-attachment film while partially heating the semiconductor substrate by a heat source incorporated in a pressing roller.

However, when incorporating a heat source into a pressing roller, the pressing roller must be formed of a material having a heat resistant temperature higher than a temperature required for the lamination. The die-attachment film presently used requires a heating temperature of about 180° C. The material of the pressing roller, when using such a film, is limited to a material such as metal or a material having a heat resistant temperature corresponding to metal.

Moreover, a high flatness is required for a surface of a roller, which is formed of a hard material such as metal. For example, when laminating a die-attachment film to a semiconductor substrate having a diameter of 200 mm, it is difficult to maintain a surface of a roller at a high flatness since a width of the roller must be 200 mm or more.

That is, if a film having a high temperature for lamination is used when a heat source is incorporated into a pressing roller used for the lamination (refer to FIG. 2), the pressing roller must be formed of a material having a heat resistance such as metal in consideration of the thermal conductivity of the pressing roller. In order to laminate without air and wrinkles over the entire surface of a substrate, a surface flatness of an order of micron is required for a metal made pressing roller and a semiconductor substrate. However, all the metal made roller, the semiconductor substrate and a chucking table onto which the semiconductor substrate is attached are considered as rigid members, and it is difficult to satisfy the requirement of high flatness required for lamination by merely increasing the surface flatness of each of the above-mentioned parts. Therefore, there may be a position at which the pressing roller partially contacts at one end in the range of a large semiconductor-substrate area. This partial contact of the pressing roller may be referred to as one-side contact. As a result, there is a problem in that air bubbles or wrinkles are formed in the laminated die-attachment film.

Figure 3:
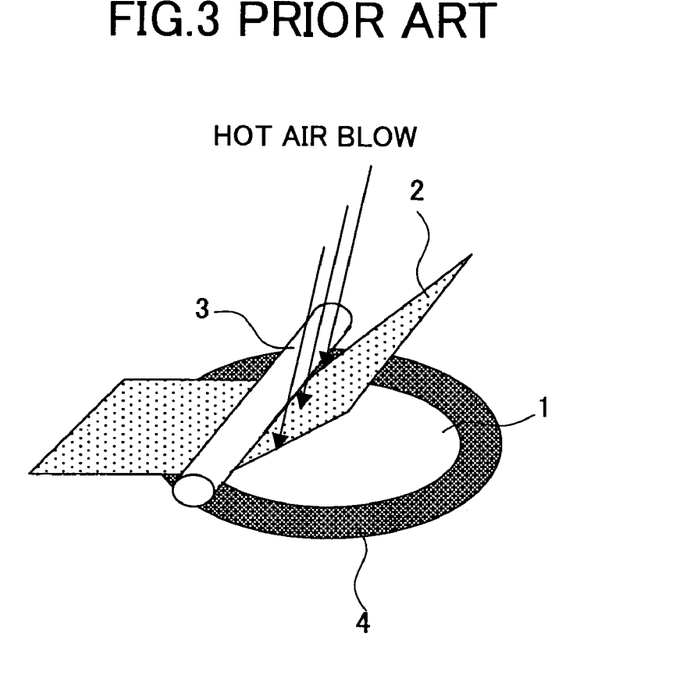
FIG. 3 is an illustration showing a conventional film lamination apparatus which blows a hot air to a film.

If the die-attachment film and the substrate are heated by blowing a hot air immediately before a roller (refer to FIG. 3), the above-mentioned problem associated with the surface flatness can be solved by forming the roller by a rubber material. In a case in which a high-temperature hot air is blown such as a condition for laminating a die-attachment film, there is no problem if the die-attachment film is thick. However, if the die-attachment film is thin, an elongation occurs in the part to which the hot air is blown, which results in a partially very thin film. In the worst case, there may happen a problem in which the die-attachment film is melted. Additionally, since a die-attachment film tends to be thinner in the future, it is expected that this problem becomes more remarkable.

There is another problem in the method of using a pressing roller formed of a rubber material. That is, there is a problem in that, depending on the surface condition of a pressing roller, a die-attachment film may adhere onto not a semiconductor substrate but the pressing roller. This problem is avoidable by applying a special process such as coating on the surface of the pressing roller so as to improve separability between the die-attachment film and the pressing roller. However, there is found no surface treatment which can be applied to a surface of a rubber made roller and also improve the separability.

SUMMARY OF THE INVENTION

It is a general object of the present invention to provide an improved and useful film lamination apparatus and method in which the above-mentioned problems are eliminated.

A more specific object of the present invention is to provide a film lamination apparatus and method in which there is no one-side contact of a pressing roller that presses a film to be laminated.

In order to achieve the above mentioned objects, there is provided according to the present invention a film lamination method for laminating a film on a principal surface of a semiconductor substrate by using a rotatable roller having a heat-generating part therein, the film lamination method comprising: pressing the roller onto the film placed on the principal surface of the semiconductor substrate while generating heat by the heat-generating part; and rolling the roller on the film so as to laminate the film on the semiconductor substrate by heat from the heat-generating part.

In the film lamination method according to the present invention, the roller may include a cylindrical metal body and a resin layer formed on an outer surface of the cylindrical metal member, and wherein the heat-generating part may be provided in a central portion of the cylindrical metal member so as to extend in an axial direction of the cylindrical-metal member. The resin layer may be formed of a fluoride resin. The roller may be a cylindrical elastic member, and a plurality of heat-generating parts may be arranged near an outer surface of the cylindrical elastic member. The cylindrical elastic member may be made of rubber or plastic. The roller may include a plurality of short rollers each having a width smaller than a width of the semiconductor substrate so that the film is laminated on the semiconductor substrate by pressing the plurality of short rollers sequentially on the film placed on the principal surface of the semiconductor substrate and rolling the short rollers on the film.

According to the above-mentioned invention, the film is laminated onto the semiconductor substrate by pressing the film onto the semiconductor substrate by the roller while heating the film by the heat-generating part provided in the roller. Accordingly, the film is partially heated by the roller at a position where the lamination is performed in synchronization with the movement of the roller. Thus, the film can be laminated on the semiconductor substrate without generation of air bubbles or wrinkles.

There is provided according to another aspect of the present invention a film lamination method for laminating a film on a principal surface of a semiconductor substrate by using a table supporting the semiconductor substrate and a rotatable roller, the table having a plurality of heat-generating parts therein, the film lamination method comprising pressing the roller onto the film placed on the principal surface of the semiconductor substrate and rolling the roller on the film while selectively activating the heat-generating parts in response to a movement of the roller so as to laminate the film on the semiconductor substrate by heat from the heat-generating parts. The heat-generating parts may be arranged so as to be parallel to a direction perpendicular to a laminating direction and thermally isolated from each other.

According to the above-mentioned invention, the film is laminated onto the semiconductor substrate by pressing the film onto the semiconductor substrate by the roller while heating the semiconductor substrate placed on table in which the heat-generating parts are provided. The semiconductor substrate is partially heated by one of the heat-generating parts that are selectively and sequentially activated in synchronization with the movement of the roller. Thus, the film can be laminated on the semiconductor substrate without generation of air bubbles or wrinkles.

Additionally, there is provided according to another aspect of the present invention a film lamination method for laminating a film on a principal surface of a semiconductor substrate by using a rotatable roller and a table supporting the semiconductor substrate, a heat-generating part being movably provided under the table, the film lamination method comprising pressing the roller onto the film placed on the principal surface of the semiconductor substrate and rolling the roller on the film while moving the heat-generating part in response to a movement of the roller so as to laminate the film on the semiconductor substrate by heat from the heat-generating part.

According to the above-mentioned invention, the film can be laminated on the semiconductor substrate by pressing the film while partially heating the semiconductor substrate by the heat-generating part that moves in synchronization with the movement of the roller. Thus, the film can be laminated on the semiconductor substrate without generation of air bubbles or wrinkles.

Further, there is provided according to another aspect of the present invention a film lamination apparatus comprising a table on which a semiconductor substrate to be processed is placed and fixed; and a roller pressing an attachment film onto the semiconductor substrate while rolling on the attachment film, wherein the roller includes: a cylindrical metal member; a heat-generating part provided in the cylindrical metal member; and a resin layer covering an outer surface of the cylindrical metal member.

According to the above-mentioned invention, since the resin layer having elasticity is provided around the cylindrical metal member, unevenness is absorbed by the elasticity of the resin layer. Thus, the attachment film can be laminated on the semiconductor substrate without generation of air bubbles or wrinkles.

Additionally, there is provided according to another aspect of the present invention a film lamination apparatus comprising: a table on which a semiconductor substrate to be processed is placed and fixed; and a roller pressing an attachment film onto the semiconductor substrate while rolling on the attachment film, wherein the roller includes: a cylindrical elastic member; and a heat-generating part provided in the cylindrical elastic member.

Further, there is provided according to the present invention a film lamination apparatus comprising: a table on which a semiconductor substrate to be processed is placed and fixed; and a roller assembly having a plurality of short rollers each pressing an attachment film onto the semiconductor substrate while rolling on the attachment film, wherein the roller assembly includes a plurality of heat-generating rods parallel to a direction perpendicular to a laminating direction, the heat-generating rods provided with cylindrical metal members, respectively, so that parts of the cylindrical metal members overlap with each other in an axial direction of the heat-generating rods.

According to the above-mentioned invention, the attachment film can be laminated onto the whole surface of the semiconductor substrate to be processed by partially pressing the attachment film by the plurality of short rollers having a small width. Since the semiconductor-substrate is heated partially and the short rollers are partially pressed onto the attachment film, the short rollers can follow unevenness of the surface of the attachment film, and, thus, there is no generation of air bubbles or wrinkles in the laminated attachment film.

Additionally, there is provided according to another aspect of the present invention a film lamination apparatus comprising: a table on which a semiconductor substrate to be processed is placed and fixed; a roller pressing an attachment film onto the semiconductor substrate while rolling on the attachment film; and a heat-generating part provided in the table, wherein the heat-generating part is divided into a plurality of small heat-generating parts arranged in a direction of movement of the roller.

According to the above-mentioned invention, the film is laminated onto the semiconductor substrate by pressing the film onto the semiconductor substrate by the roller while heating the semiconductor substrate placed on table in which the small heat-generating parts are provided. The semiconductor substrate is partially heated by one of the small heat-generating parts that are selectively and sequentially activated in synchronization with the movement of the roller. Thus, the film can be laminated on the semiconductor substrate without generation of air bubbles or wrinkles.

Additionally, there is provided according to another aspect of the present invention a film lamination apparatus comprising: a table on which a semiconductor substrate to be processed is placed and fixed; a roller pressing an attachment film onto the semiconductor substrate while rolling on the attachment film; and a heat-generating part provided under the table, the heat-generating part being movable in response to a movement of the roller.

According to the above-mentioned invention, the film can be laminated on the semiconductor substrate by pressing the film while partially heating the semiconductor substrate by the heat-generating part that moves in synchronization with the movement of the roller. Thus, the film can be laminated on the semiconductor substrate without generation of air bubbles or wrinkles.

Additionally, there is provided according to another aspect of the present invention a manufacturing method of a semiconductor device, comprising the steps of: grinding another principal surface of the semiconductor substrate so as to thin the semiconductor substrate; applying an attachment film onto the another principal surface of the semiconductor substrate; and individualizing the semiconductor substrate into a plurality of semiconductor elements, wherein the attachment film is laminated on the semiconductor substrate by pressing the attachment film placed on the another principal surface of the semiconductor substrate by a rotatable roller having a heat-generating part therein and rolling the roller on the attachment film while generating heat by the heat-generating part.

Additionally, there is provided according to another aspect of the present invention a manufacturing method of a semiconductor device, comprising the steps of: grinding another principal surface of the semiconductor substrate so as to thin the semiconductor substrate; applying an attachment film onto the another principal surface of the semiconductor substrate; and individualizing the semiconductor substrate into a plurality of semiconductor elements, wherein the attachment film is laminated on the semiconductor substrate by pressing by a rotatable roller the attachment film placed on the another principal surface of the semiconductor substrate that is placed on a table provided with a plurality of heat-generating parts therein and rolling the roller on the attachment film while selectively causing the heat-generating parts to generate heat in response to a movement of the roller.

Further, there is provided according to another aspect of the present invention a manufacturing method of a semiconductor device, comprising the steps of: grinding another principal surface of the semiconductor substrate so as to thin the semiconductor substrate; applying an attachment film onto the another principal surface of the semiconductor substrate; and individualizing the semiconductor substrate into a plurality of semiconductor elements, wherein the attachment film is laminated on the semiconductor substrate by pressing by a rotatable roller the attachment film placed on the another principal surface of the semiconductor substrate that is placed on a table for supporting the semiconductor substrate and rolling the roller on the attachment film while moving a heat-generating part provided under the table in response to a movement of the roller, the heat-generating part generating heat while moving Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of embodiments of the present invention.

Figure 4:
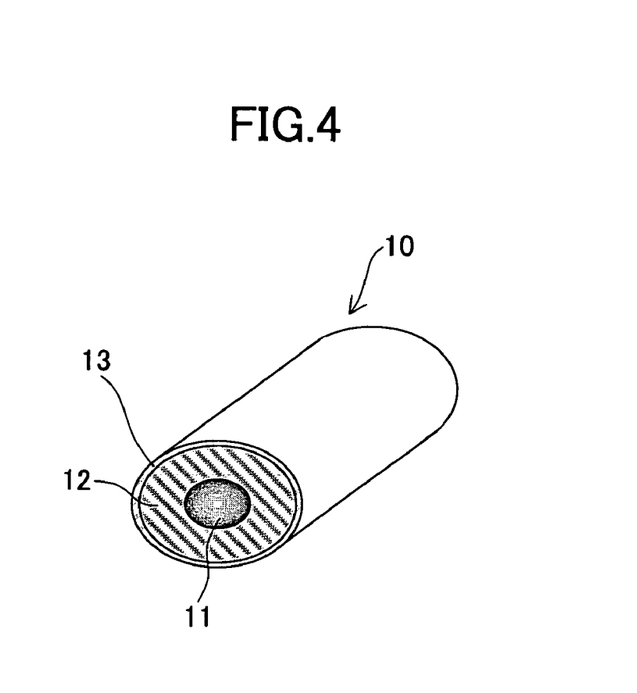
FIG. 4 is a perspective view of a pressing roller for performing a film lamination method according to a first embodiment of the present invention.

FIG. 4 shows a structure of a pressing roller 10 for performing a film lamination method according to a first embodiment of the present invention.

A main part 12 of the pressing roller 10 according to the present embodiment is made of an aluminum (Al) alloy of a cylindrical shape having a diameter of 20-50 mm. A heater 11 is provided by being inserted into a central portion (center axis) of the roller main part 12 with a length corresponding to the roller main part 11. An outer surface of the main part 12 of the pressing roller 10 is covered by a coating of a fluoride resin layer 13 having a thickness of 0.1-0.3 mm. The pressing roller 10 is used in the film lamination apparatus shown in FIG. 2, which performs a conventional method, by replacing the conventional roller.

According to the lamination method using the pressing roller 10 according to the present invention, heat generated by the heater 11 is conducted to the outer surface of the pressing roller 10 effectively since the roller main part 12 is made of metal.

Moreover, since the fluoride resin layer 13 is provided on the outer surface of the main part 12 of the pressing roller 10, separability between the pressing roller 10 and a die-attachment film can be improved.

Furthermore, unevenness of the outer surface of the roller main part 12 can be absorbed by elastic deformation of the resin layer 13 during a lamination operation.

Therefore, the outer surface of the roller main part 12 does not require a high accuracy in the surface flatness, and, thus, the pressing roller 10 can be produced at a low cost.

When laminating a die-attachment film using the pressing roller 10 according to the first embodiment of the present invention, referring to the above-mentioned structure shown in FIG. 2, a principal surface (element formation surface), of the semiconductor substrate 1 to be processed is covered by a protective tape beforehand and, thereafter, the backside of the semiconductor substrate 1 is attracted by vacuum and fixed onto the table 4A. It is preferable that the attraction is assured by forming the table 4A from vaporous metal material such as a stainless steel sintered material. Moreover, inside the table 4A concerned, it is unnecessary to provide a heater, considering the structure of the above-mentioned lamination roller 10.

If a heating temperature in the lamination of the die-attachment film 2 is 180° C., a temperature of the surface (that is, a surface contacting the die-attachment film 2) of the resin sheet (resin layer) 13 can be heated up to 180° C. by heating the heater 11 as a heat source or heat-generating part at 200° C. Since the roller main part 12 is mad of metal, the heat generated by the heater 11 arranged in the central part reaches the thin resin sheet 13 by conducting the metal part, and, thereby, a difference in temperature between the heater 11 and the resin sheet 13 can be suppressed to about 20° C.

The die-attachment film 2 is placed on the semiconductor substrate 1 fixed to the table 4A, and the die-attachment film 2 is stuck on the semiconductor substrate 1 by rolling the pressing roller on the die-attachment film 2. As mentioned above, the resin sheet 13 is provided on the outer surface of the pressing roller 10, and, thus, the unevenness of the surface of the die-attachment film 2 can be absorbed by the elastic deformation characteristic of the resin sheet 13. Therefore, there is no air bubbles or winkles in the die-attachment film which may be caused by one-side contact due to unevenness of the surface such as in the lamination by a metal roller.

Moreover, the die-attachment film 2 is prevented from adhering to the pressing roller 10 due to an excellent separability of the resin sheet 13.

During the lamination process, the heater 11 provided in the center of the roller main part 12, the roller main part 12 and the outermost resin sheet 13 are heated in that order. The heat of the resin sheet 13 is transmitted to the die-attachment film 2, and the die-attachment film 2, comes to show adhesion by the heat from the pressing roller 10, and is stuck on the semiconductor substrate 1.

Here, if a diameter of an outermost periphery of the pressing roller 10 is about 20-50 mm, the pressing load of 10-20 N is appropriate.

The lamination process gradually progresses as the pressing roller 10 rolls on the die-attachment film 2, and finally the die-attachment film 2 is laminated on the entire backside of the semiconductor substrate 1.

Figure 5:
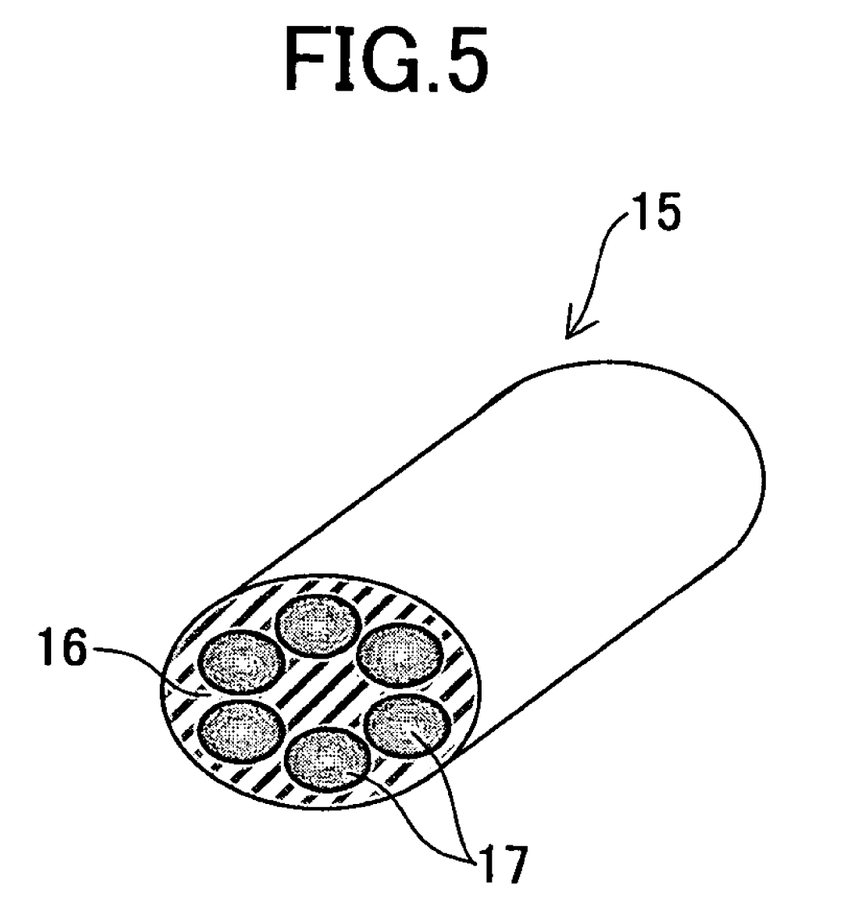
FIG. 5 is a perspective view of a pressing roller for performing a film lamination method according to a second embodiment of the present invention.

A description will now be given, with reference to FIG. 5, of a second embodiment of the present invention. FIG. 5 shows a structure of a pressing roller 15 for performing a film lamination method according to a second embodiment of the present invention.

A roller main part 16 of the pressing roller 15 is formed of an elastic material such as rubber or plastic with a cylindrical shape having a diameter of 20-50 mm. A plurality of heaters 17 are provided by being inserted into the roller main part 16 with a length corresponding to the length of the roller main part 16.

The pressing roller 15 according to the second embodiment of the present invention is applicable to a die-bonding film exhibiting an adhesion at a relatively low temperature such as a heating temperature of about 100° C.

Similar to the above-mentioned first embodiment, the pressing roller 15 is used in the film lamination apparatus shown in FIG. 2, which performs a conventional method, by replacing the conventional roller.

Unlike the pressing roller 10 shown in FIG. 4, the roller main part 16 of the pressing roller 15 shown in FIG. 5 is formed of a nonmetallic material such as rubber or plastic. Since rubber or plastic has elasticity, the pressing roller 15 follows the unevenness of the surface of the semiconductor substrate 1, and, thus, high flatness is not required for the surface of the pressing roller.

However, since rubber or plastic generally has a low heat resistance and a low thermal conductivity, if a heater is incorporated into a central portion of the roller main part 16, there may be a problem in that the roller mainpart 16 cannot withstand the heat generated by the heater. That is, a difference in temperature between the heater located in the center of the roller main part 16 and the surface of the roller main part 16 is large. Accordingly, even when the surface of the pressing roller 15 is maintained at a temperature of about 100° C., the heater in the center of the roller main part 16 must be heated at a temperature of 150° C. to 200° C.

Thus, in the pressing roller 15 shown in FIG. 5, the plurality of heaters 17 are incorporated into the roller main par 16 in a state where the heaters 17 are arranged along the outer surface of the roller main part 16 so as to minimize a distance between the outer surface of the roller main part 16 and each of the heaters 17. Since the distance between the outer surface of the roller main part 16 and each of the heaters 17 is small, the temperature of the outer surface of the roller main part 16 can be maintained at 100° C. by maintaining the heaters at a temperature of about 120° C. Therefore, a nonmetallic material such as a silicone rubber having a low heat-resistant temperature can be used as, a material of the roller main part 16.

If the lamination temperature of the die-attachment film 2 to be used is about 100° C. or less, there is no need to use a metal made roller and the pressing roller 15 can be formed of a nonmetallic material. And if the plurality of heaters 17, which are incorporated into the pressing roller 15, are arranged as close to the outer surface of the roller main part 16 as possible, the surface temperature of the pressing roller 15 rises sufficiently even if a material having a low thermal conductivity is used for the roller main part 16 and the surface unevenness can be absorbed by using the elastic deformability, thereby achieving a reliable lamination.

The form of each of the heaters 17 incorporated into the roller main part 16 is not limited to that explained in the embodiment, and cylindrical shape, a linear shape or sheet-like shape may be used. Additionally, there is no limitation in the material of the roller main part 16, and the material may be selected in accordance with a temperature required for the die-attachment film.

In the film lamination method according to the above-mentioned first and second embodiments, an amount of heat transmitted from the pressing roller reduces as a distance from a heat source increases.

Figure 6:
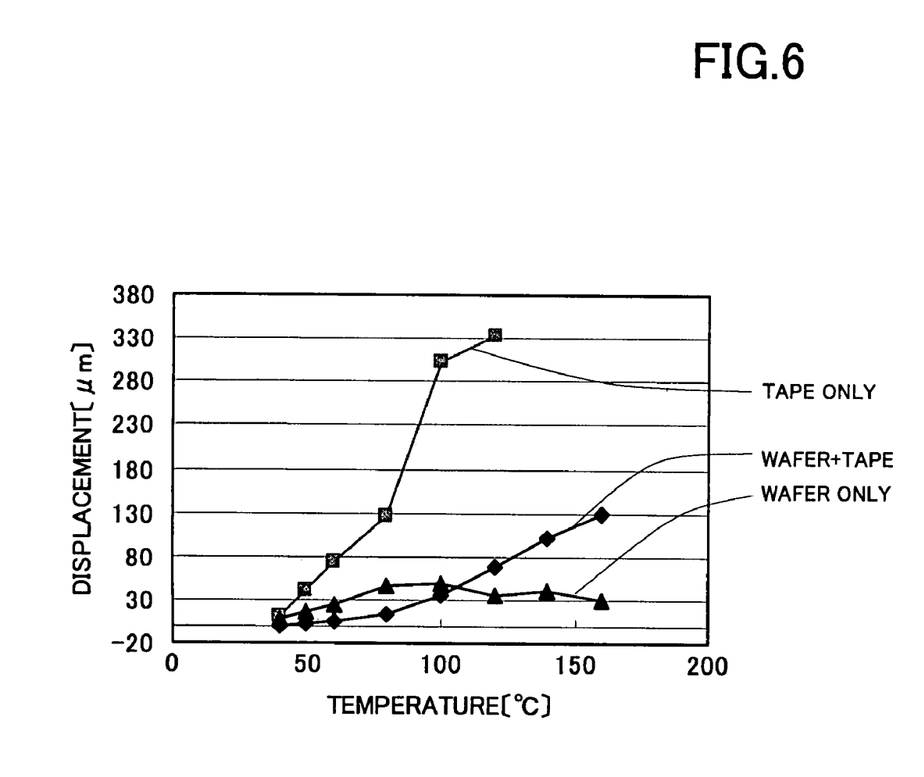
FIG. 6 is a graph showing a result of investigation of a displacement of a silicon semiconductor substrate having a diameter of 200 mm by heating an entire surface thereof.

FIG. 6 is a graph showing a result of investigation of a displacement (an increased amount in diameter) of a silicon semiconductor substrate having a diameter of 200 mm by heating an entire surface thereof. Although the displacement of the semiconductor substrate is about 50 μm at maximum when the semiconductor substrate alone was heated, a displacement of a protective film, when the protective film alone is heated, reaches 300 μm at 100° C. Therefore, when the semiconductor substrate is heated where the protective tape is laminated on the semiconductor substrate, the semiconductor substrate is stretched due to thermal expansion of the protective tape, which results in a displacement as large as 100 μm at 150° C.

Figure 7:
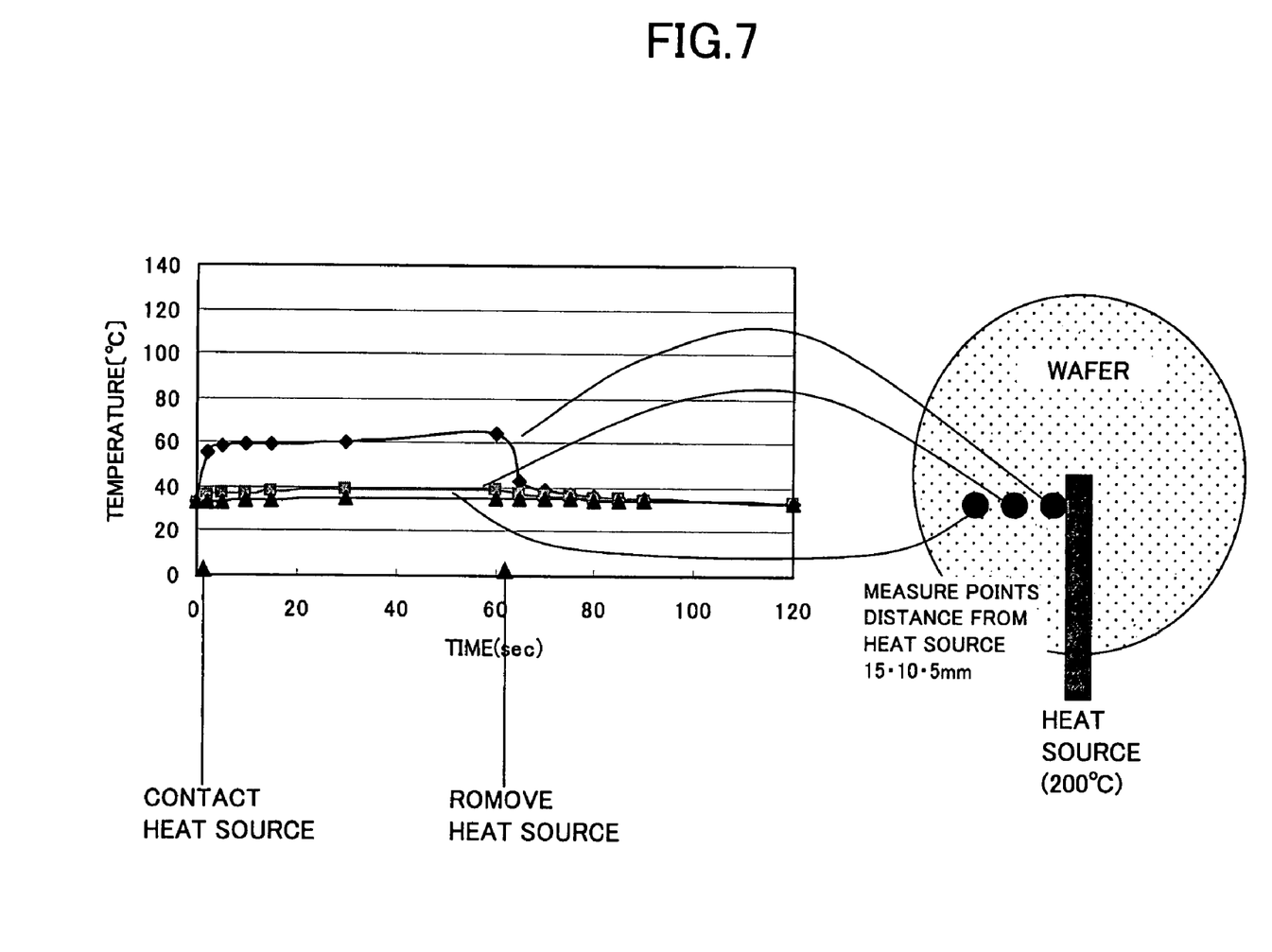
FIG. 7 is a graph showing a change in temperature of a silicon semiconductor substrate when the silicon semiconductor substrate is locally heated by a heat source of 200° C.

Moreover, FIG. 7 is a graph showing a change in temperature of a silicon semiconductor substrate when the silicon semiconductor substrate is locally heated by a heat source of 200° C. In the graph of FIG. 7, temperatures at positions away from the heat source by distances of 5 mm, 10 mm and 15 mm are indicated. As shown in FIG. 7, the temperature of the semiconductor substrate at a position away from the heat source by a distance of 5 mm is 60° C., while the temperatures at positions away from the heat source by distances 10 mm and 15 mm are below 40° C., which indicates that there is less thermal stress due to thermal expansion.

Although cracking in the semiconductor substrate was expected when the temperature of the semiconductor substrate exceeded 60° C., according to the graph of FIG. 7, an area of the semiconductor substrate in which the temperature rises up to 60° C. is limited to an area within about 5 mm from the heat source (heater). Thus, an actually heated area is small and the semiconductor substrate is merely heated locally. Moreover, when the heat source is separated away from the semiconductor substrate, the temperature of the semiconductor substrate returns to a normal temperature in about 5 seconds.

It can be appreciated from the above-mentioned matter that influence of the thermal expansion of the semiconductor substrate due to heating using the pressing roller is slight and there is no generation of cracking of the semiconductor substrate. That is, since the semiconductor substrate is locally heated by the pressing roller, the thermal expansion of the semiconductor substrate occurs locally. Thus, the thermal stress is relaxed by other portions of the semiconductor substrate, and there is no thermal stress which may cause cracking of the semiconductor substrate.

Figure 8A:
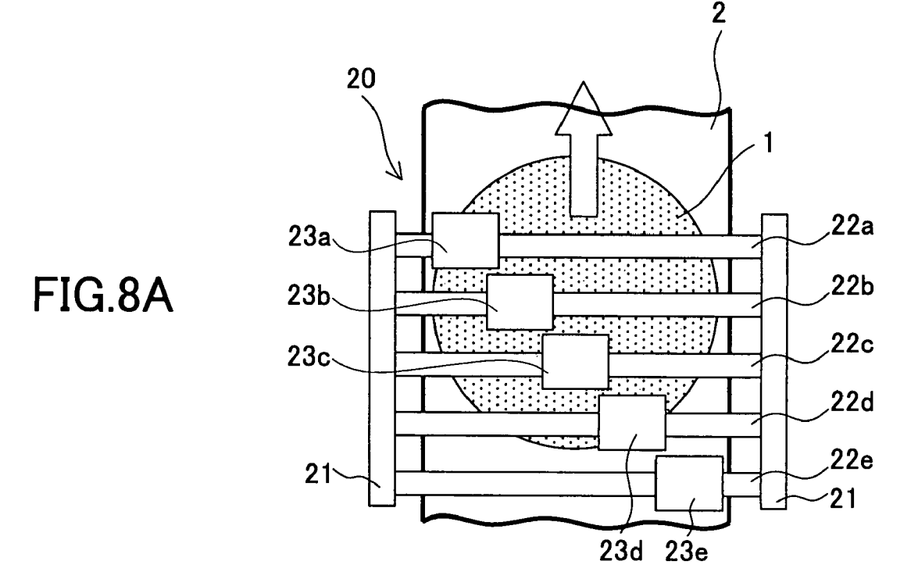
FIG. 8A is a plan view of a film lamination apparatus, which performs a film lamination method according to a third embodiment of the present invention.
Figure 8B:
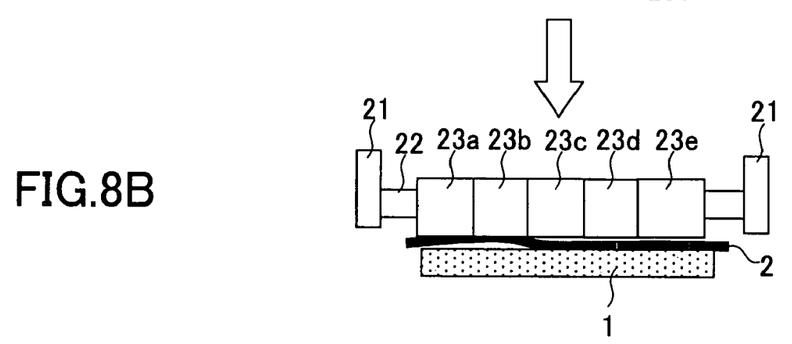
FIG. 8B is a front view of the film lamination apparatus shown in FIG. 8A.
Figure 8C:
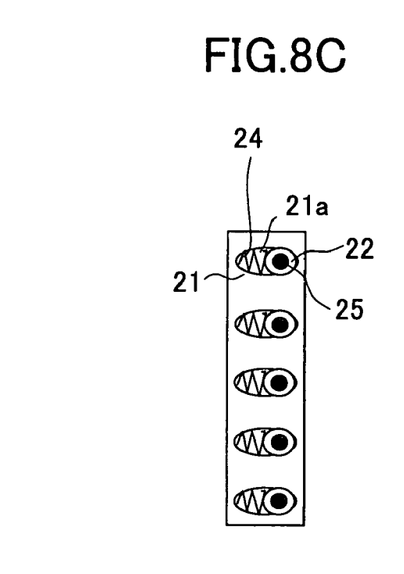
FIG. 8C is a side view of the film lamination apparatus shown in FIG. 8A.

A description will now be given, with reference to FIGS. 8A, 8B and 8C, of a film lamination apparatus which performs a film lamination method according to a third embodiment of the present invention. FIG. 8A is a plan view of a film lamination apparatus, which performs a film lamination method according to the third embodiment of the present invention; FIG. 8B is a front view of the film lamination apparatus shown in FIG. 8A; FIG. 8C is a side view of the film lamination apparatus shown in FIG. 8A.

In the film lamination apparatus according to the present embodiment, a plurality of pressing, rollers are combined in a laminating direction so as to be configured and arranged to be a roller assembly 20.

That is, unlike the above-mentioned embodiments, a predetermined lamination width is not covered by a single roller but the predetermined lamination width is covered by a combination of a plurality of rollers each having a length smaller than the roller main part of the above-mentioned embodiments.

In the roller assembly 20 of the present embodiment, a plurality of metal made pressing rollers 23a-23e each having a predetermined length are arranged in the laminating direction by being supported by separate rotation axes (heat source rods) 22a-22e, respectively, in a state in which the adjacent rollers partially overlaps with each other in the direction of lamination width.

The laminating operation is performed, as shown in FIG. 8, by pressing a die-attachment film 2 onto the semiconductor substrate sequentially by the rollers 23a through 23e in the laminating direction indicated by arrows in the figure.

Accordingly, an area where a single roller contacts the die-attachment film 2 is small, and, thus, a temperature rise in the contacting area can be suppressed. For this reason, the temperature rise of a thinned semiconductor substrate can be suppressed which prevents cracking of the semiconductor substrate.

The roller assembly 20 comprises: a pair of side plates 21; the five heat source rods 22a-22d supported between the side plates 21; and pressing rollers 23a-23e rotatably supported by the heat source rods 22a-22e, respectively. The side plates 21 are provided with openings 21a so as to support the five heat source rods 22a-22e in an aligned state. Each of the openings 21a has a shape elongated in a direction perpendicular to the aligning direction, and a compression spring 24 an elastic member is provided in each of the openings 21a. Although the compression springs 24 are arranged so as to urge the respective heat source rods 22a-22e, the heat source rods 22a-22e can move within the respective openings 21a against the urging force of the compression springs 24. It should be noted that an elastic material such as rubber can be used for the compression springs 24.

A heater 25 is incorporated into each of the heat source rods 22a-22e so as to heat the heat source rods 22a-22e. The heat source rods 22a-22e are rotatably provided with the pressing rollers 23a-23e made of metal such as, for example, aluminum. More specifically, each of the pressing rollers 23a-23e has a through hole (not shown) into which the respective one of the heat source rods 22a-22e is inserted. The through hole has a size that allows each of the heat source rods 22a-22s to be loose-fitted. Accordingly, when the heat source rods 22a-22e are heated by the heaters 25, the heat is transmitted to the pressing rollers 23a-23e that are in contact with the heaters within the through holes, there by heating the pressing rollers 23a-23e. It should be noted that the size of the through holes 23a-23e is set so that the pressing rollers 23a-23e are rotatable relative to the respective heat source rods 22a-22e even if the heat source rods are thermally expanded. As mentioned above, the pressing rollers 23a-23e are heated by receiving heat from the heat source rods 22a-22e while rotating relative to the respective heat source rods 22a-22e.

A width of each of the pressing rollers 23a-23e rotatably supported by the respective one of the heat source rods 22a-22e is set to 30-40 mm. This is the size that permits a laminating operation without one-side contact even if the pressing rollers are made of metal, which eliminates air bubbles and wrinkles. An outer diameter of each of the pressing rollers 23a-23e is preferably about 20 mm to 50 mm.

As mentioned above, each of the heat source rods 22a-22e is supported by the side plates 21, and can be freely moved by the compression spring 24. Furthermore, the heater 25 is embedded in each of the heat source rods 22a-22e so as to transmit heat to the respective pressing rollers 23a-23e. Therefore, if the pressing rollers 23a-23e are rolled with a pressure of about 5-10 N, the lamination of the die-attachment film 2 can be performed with a width of 30-40 mm of each of the pressing rollers. The sets of the pressing rollers 23a-23e and the heat source rods 22a-22e are arranged with an offset state (five sets in the present embodiment) so as to cover the entire semiconductor substrate 1. The adjacent pressing rollers 23 are arranged so as to overlap about 5 mm with each other so that a gap is prevented from being formed between the adjacent pressing rollers.

According to the above-mentioned structure of the roller assembly 20, there is no air bubbles or wrinkles formed in the laminated die-attachment film 2 due to one-side contact of the pressing roller or unevenness of the surface of the pressing roller, and, thus, the die-attachment film 2 can be laminated on the semiconductor substrate 1.

In the present embodiment, the pressing roller is divided into the pressing rollers 23a-23e each having a small width, and the die-attachment film 2 and the semiconductor substrate 1 are heated locally by the pressing rollers even in the axial direction of the pressing rollers. Therefore, cracking of the semiconductor substrate caused by thermal expansion can be prevented.

Moreover, since each of the metal made pressing rollers 23a-23e has a small width, the surfaces of the pressing rollers can be formed with high accuracy of flatness. In addition, since each of the pressing rollers 23a-23e is movable in the vertical direction (direction off pressing the die-attachment film), each of the pressing rollers 23a-23e can follow local unevenness of the semiconductor substrate 1 and a local change in the thickness of the die-attachment film 2.

Figure 9A:
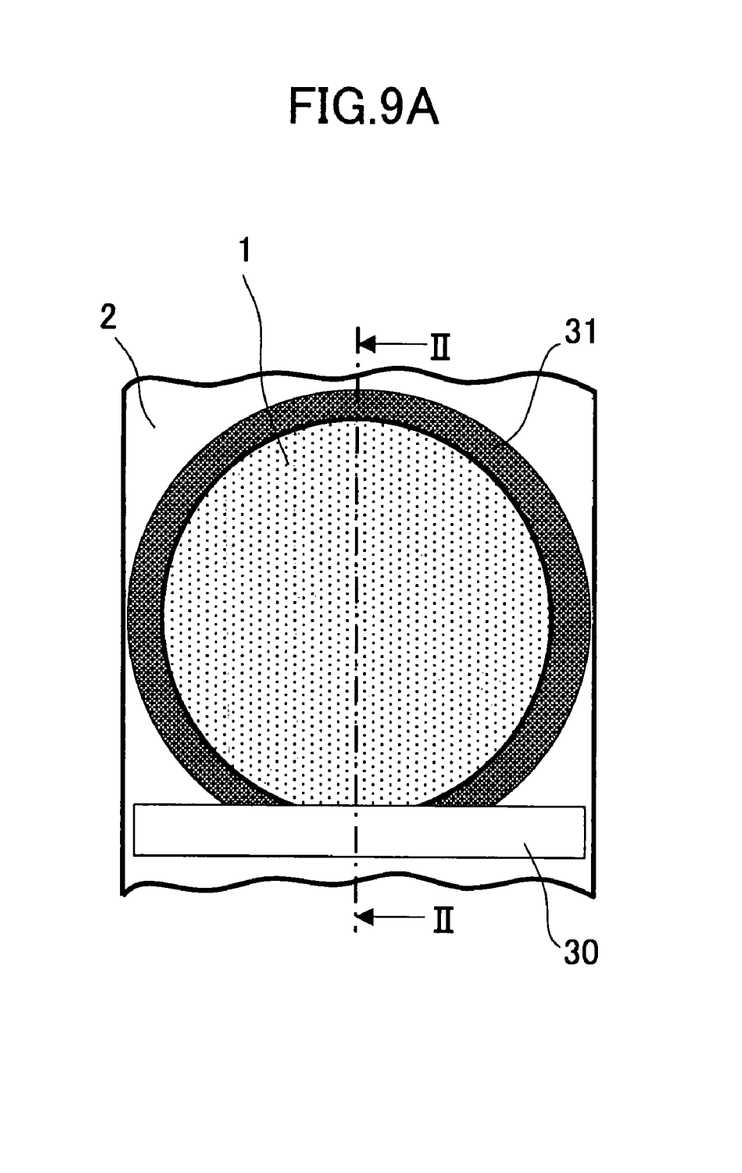
FIG. 9A is a plan view of a film lamination apparatus for performing a film lamination method according to a fourth embodiment of the present invention.
Figure 9B:
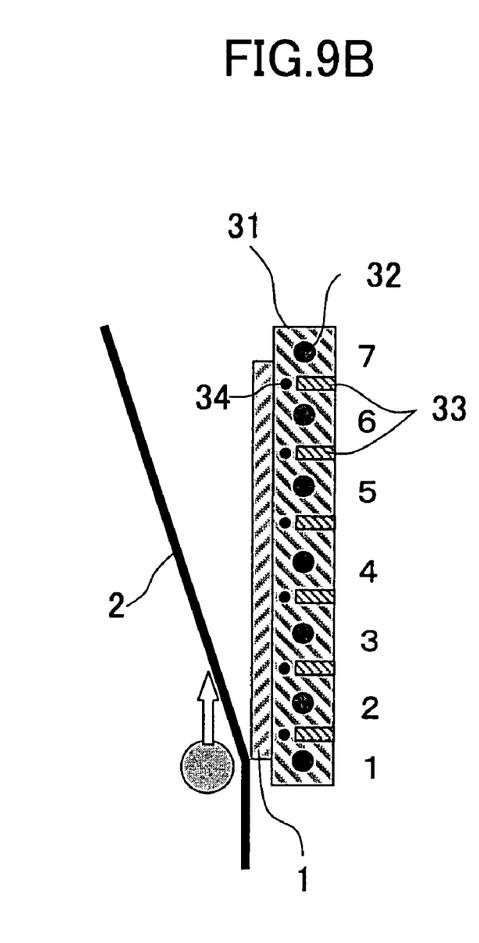
FIG. 9B is a cross-sectional view of the film lamination apparatus taken along a line I-I of FIG. 9A.

A description will now be given, with reference to FIGS. 9A and 9B, of a fourth embodiment of the present invention. FIG. 9A is a plan view of a film lamination apparatus for performing a film lamination method according to the fourth embodiment of the present invention, and FIG. 9B is a cross-sectional view of the film lamination apparatus taken along a line I-I of FIG. 9A.

In the film lamination apparatus according to the present embodiment, unlike the above-mentioned embodiments, a heater for heating the semiconductor substrate and the die-attachment film is incorporated into the table.

That is, in the film lamination apparatus according to the present embodiment, a plurality of rod-like heaters 32 (seven in an example shown in the figures) are arranged in the table 31 so that the heaters 32 extend in a direction substantially perpendicular to the laminating direction and apart from each other in the laminating direction.

Heat conduction between adjacent heaters 32 is suppressed by providing a heat-insulating plate 33 between the adjacent heaters 32 or forming a slit having an appropriate width between the adjacent heaters 32.

After covering the principal surface (circuit formation surface) of the semiconductor substrate 1 to be processed by a protective film, the semiconductor substrate 1 is fixed onto the table 31 with the backside facing upward. It is preferable to form at least a surface part of the table 31 by a porous material such as a stainless steel sintered material as mentioned above so as to assure the vacuum attraction of the semiconductor substrate 1.

Then, the die-attachment film 2 placed on the semiconductor substrate 1 is pressed by a movable roller 30 so as to laminate the die-attachment film 2 on the backside of the semiconductor substrate 1. In this method, there is no need to provide a heat generating means in the roller 30 since the heaters 32 are provided in the table 31, which allows the roller 30 formed of a cylindrical member made of a material having elasticity such as a silicon rubber or a plastic.

In the Present embodiment, an electric current is selectively supplied to one of the heaters 32 located ahead of the roller 30, in response to the movement of the roller 30 in the laminating direction so as to make the one of the heaters 32 to generate a heat. Since the heaters 32 immediately ahead and behind the heater 32 concerned are thermally insulated from the heater 32 concerned by heat-insulating materials or slits, the heat receiving area of the die-attachment film 2 is maintained to be small, which suppresses a temperature rise in portions other than the portion corresponding to the heater 32 to which an electric current is being supplied. For is reason, the temperature rise of the thinned semiconductor substrate 1 can be suppressed, and cracking of the semiconductor substrate 1 can be prevented.

Moreover, cooling holes 34 are provided between each of the heat-insulating plates 33 and the surface of the table 31 so that a cooling medium such as an air or a cooling water can flow therethrough. A part of the table 31 in which the laminating operation is ended can be forcibly cooled by flowing the cooling medium through the cooling holes 34, which results in minimization of a heated part of the semiconductor substrate 1. The cooling holes are not necessarily provided, and the heated part of the semiconductor substrate 1 may be cooled by spontaneous cooling after the heating of the corresponding heater 32 is ended.

The table 31 is formed of a porous material such as a stainless steel sintered material so that the entire surface of the semiconductor substrate 1 can be attracted uniformly. The semiconductor substrate 1 is fixed onto the table by vacuum attraction, and the die-attachment film 2 is placed on the semiconductor substrates 1. Then, a laminating operation is performed while rolling the pressing roller 30 on the surface of the die-attachment film 2. The pressing roller 30 is made of rubber like that conventionally used. An outer diameter of the pressing roller 30 is about 20 mm to 50 mm, and an appropriate load for lamination is 20-30 N. The pressing roller 30 has elasticity, and, thus, if the width of the pressing roller 30 is the same as the diameter of the semiconductor substrate 1 there is no formation of air bubbles or wrinkles due to one-side contact.

Here, when moving the pressing-roller 30, the die-attachment film 2 and the semiconductor substrate 1 directly under the pressing roller 30 must be heated. A plurality of the cartridge heaters 32 used as a heat source are embedded in the table 31 in parallel to the pressing roller 30 and substantially perpendicular to the moving direction of the pressing roller 30.

Figure 10:
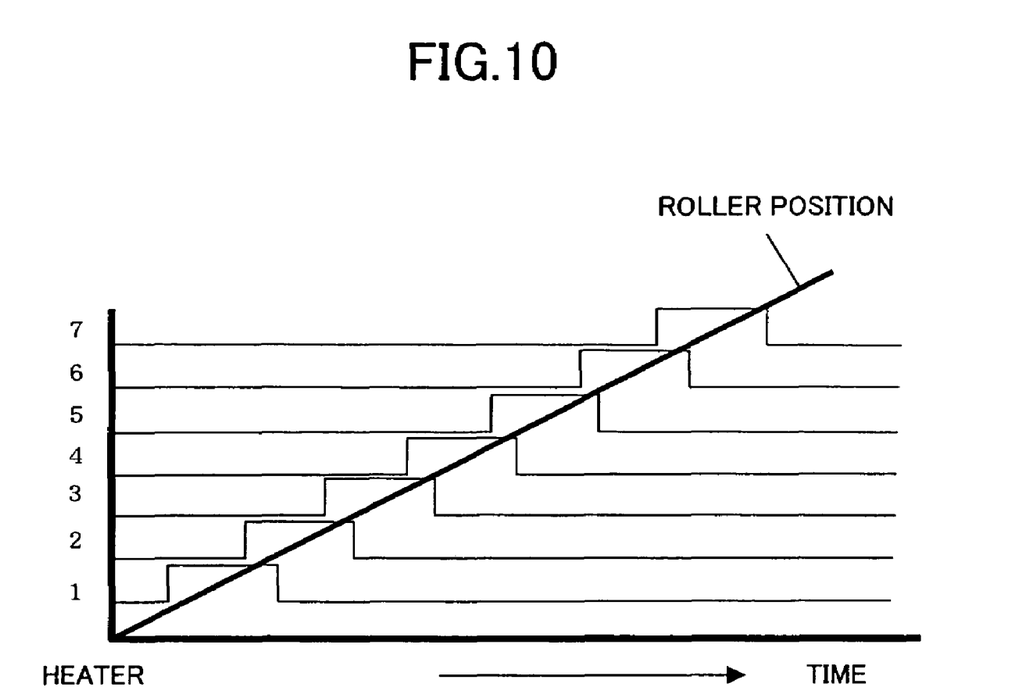
FIG. 10 is a timing chart of heating of heaters embedded in a table shown in FIGS. 9A and 9B.

FIG. 10 is a timing chart of heating of the heaters 32 embedded in the table 31. An electric current is supplied to the heaters 32 so as to heat the table 31 in response to a position of the moving pressing roller 30 so that a temperature of the table 31 directly under the pressing roller 30 becomes highest. Therefore, it is effective to carry out pre-heating of the heater 32 preceding to the movement of the pressing roller 30 in an area which is subjected to a laminating operation next.

After completion of the laminating operation in one area, heating by the heater 32 in the one area is immediately stopped, and the one area is spontaneously cooled or forcibly cooled by a method such as air-cooling or a water-cooling using the cooling holes 34.

As mentioned above, according to the present embodiment, the laminating operation can be performed while selectively heating a part of the semiconductor substrate 1 by controlling heating and cooling of the table 31 on an individual area basis. Therefore, there is no cracking of the semiconductor substrate such as that occurs when the entire surface of the semiconductor substrate 1 is heated.

Figure 11A:
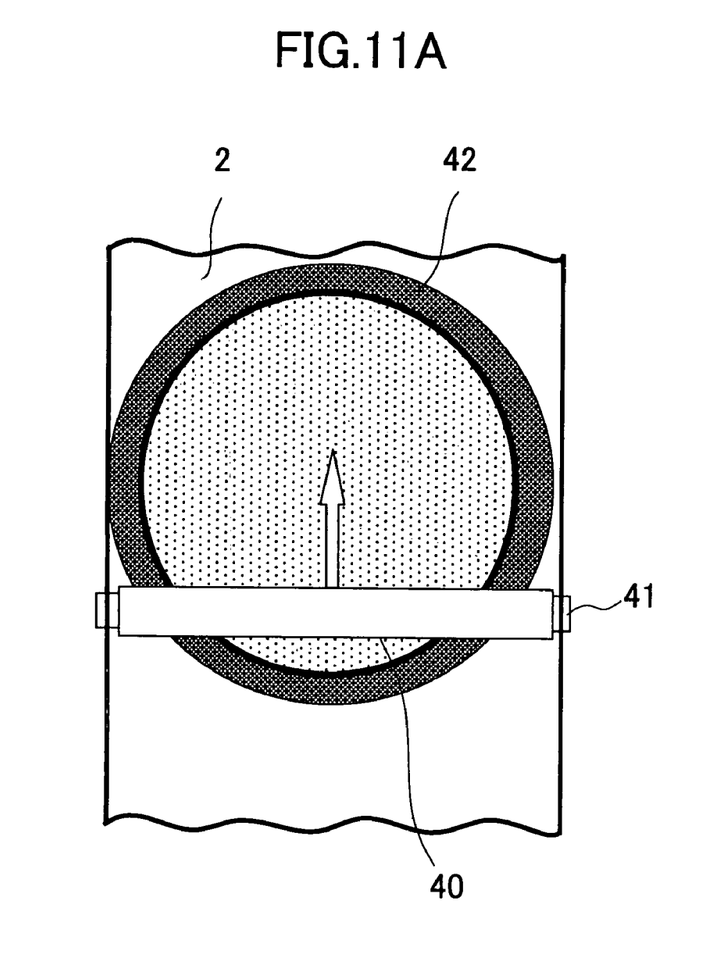
FIG. 11A is a plan view of a film lamination apparatus for performing a film lamination method according to a fifth embodiment of the present invention.
Figure 11B:
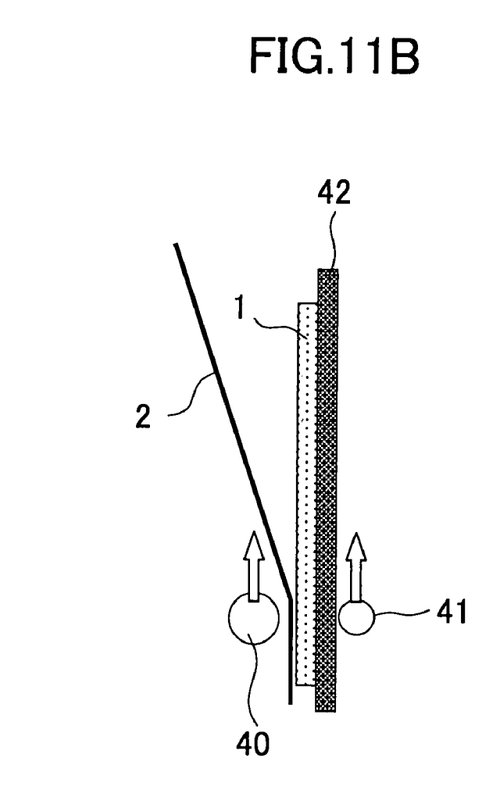
FIG. 11B is a cross-sectional view of the film lamination apparatus taken along a line II-II of FIG. 11A.

A description will now be given, with reference to FIGS. 11A and 11B, of a fifth embodiment of the present invention. FIG. 11A is a plan view of a film lamination apparatus from performing a film lamination method according to the fifth embodiment of the present invention, and FIG. 11B is a cross-sectional view of the film lamination apparatus taken along a line II-II of FIG. 11A.

In the film lamination apparatus according to the present embodiment, unlike the above-mentioned embodiments, a heater for heating the semiconductor substrate 1 and the die-attachment film 2 is provided movably.

That is, in the film lamination apparatus according to the present embodiment, a rod-like heater 41, which extends in a direction substantially-perpendicular to the laminating direction, is provided under the table 42 so as to be moved or rolled in the laminating direction.

After covering the principal surface (circuit formation surface) of the semiconductor substrate 1 to be processed by a protective film, the semiconductor substrate 1 is fixed onto the table 42 with the backside facing upward. It is preferable, to form at least a surface part of the table 42 by a porous material such as a stainless steel sintered material as mentioned above so as to assure the vacuum attraction of the semiconductor substrate 1.

Then, the die-attachment, film 2 placed on the semiconductor substrate 1 is pressed by a movable roller 40 so as to laminate the die-attachment film 2 on the backside of the semiconductor substrate 1. In this method, there is no need to provide a heat generating means in the roller 40 since the heater 41 is provided on the side of the table 42, which allows the roller 40 formed of a cylindrical member made of a material having elasticity such as a silicon rubber or a plastic.

In the present embodiment, the heater 41 is moved so as to be located directly under the roller 40 in response to the movement of the roller 40 in the laminating direction, and an electric current is supplied to the eater 41 so as to generate heat. Since only a portion to be laminated is selectively heated due to the movement of the heater 41 in response to the movement of the roller 40, a temperature rise in the thinned semiconductor substrate 1 can be suppressed, which prevents the semiconductor substrate from cracking.

The present invention is not limited to the specifically disclosed embodiments, and variations and modifications may be made without departing from the scope of the present invention.

The present application is based on Japanese priority application No. 2002-348788 filed Nov. 29, 2002, the entire contents of which are hereby incorporated by reference.

What is claimed is:

1. A film lamination method for laminating a film on a principal surface of a semiconductor substrate by using a rotatable roller having a diameter of about 20-50 mm, a heat-generating part therein and an elastically deformable resin layer on an outer surface thereof, the film lamination method comprising:

pressing the roller onto the film placed on the principal surface of the semiconductor substrate while generating heat by the heat-generating part;

rolling the roller on the film so as to laminate the film on the semiconductor substrate by heat only from the heat-generating part while absorbing unevenness of the outer surface of the roller and unevenness of a surface of the film by elastic deformation of the elastically deformable resin layer;

wherein said roller presses the film with a pressing load of 10-20N;

wherein the heat-generating part is heated to about 200° C.; and about 5 seconds after the roller is pressed to an area of the principal surface of the semiconductor substrate said area returns to a temperature about equal to the area's temperature prior to contact with the roller.

2. The film lamination method as claimed in claim 1, wherein said roller includes a cylindrical metal body and the resin layer formed on an outer surface of the cylindrical metal member, and wherein the heat-generating part is provided in a central portion of the cylindrical metal member so as to extend in an axial direction of the cylindrical metal member.

3. The film lamination method as claimed in claim 2, wherein said resin layer is formed of a fluoride resin.

4. A manufacturing method of a semiconductor device, comprising the steps of:

grinding another principal surface of the semiconductor substrate so as to thin the semiconductor substrate;

applying an attachment film onto the another principal surface of the semiconductor substrate; and individualizing the semiconductor substrate into a plurality of semiconductor elements, wherein the attachment film is laminated on the semiconductor substrate by pressing the attachment film placed on the another principal surface of the semiconductor substrate by a rotatable roller having a diameter of about 20-50 mm, a heat-generating part therein and an elastically deformable resin layer on an outer surface thereof, and rolling the roller on the attachment film while generating heat by only the heat-generating part while absorbing unevenness of the outer surface of the roller and unevenness of a surface of the film by elastic deformation of the elastically deformable resin layer;

wherein said roller presses the film with a pressing load of 10-20N;

wherein the heat-generating part is heated to about 200° C.; and about 5 seconds after the roller is pressed to an area of the principal surface of the semiconductor substrate said area returns to a temperature about equal to the area's temperature prior to contact with the roller.

5. The film lamination method as claimed in claim 1, wherein the difference in temperature between said heat generating part and said film during rolling is about 20° C.

* * * * *